(12) United States Patent
Garcia et al.

(10) Patent No.: US 8,373,313 B2
(45) Date of Patent: Feb. 12, 2013

(54) THREE-WAY SWITCH FOR HOME AUTOMATION APPARATUS AND METHOD

(75) Inventors: Ben L. Garcia, Cumming, GA (US); Yan Rodriguez, Suwanee, GA (US); Steven Karl Maurer, Pensacola, FL (US)

(73) Assignee: HomeRun Holdings Corporation, Pensacola, FL (US)

( * ) Notice: Subject to any disclaimer, the term of this patent is extended or adjusted under 35 U.S.C. 154(b) by 338 days.

(21) Appl. No.: 12/816,140

(22) Filed: Jun. 15, 2010

(65) Prior Publication Data

US 2011/0141647 A1 Jun. 16, 2011

Related U.S. Application Data

(60) Provisional application No. 61/187,020, filed on Jun. 15, 2009.

(51) Int. Cl.
 *H01H 7/00* (2006.01)
 *H01H 43/00* (2006.01)

(52) U.S. Cl. ........................................ 307/141

(58) Field of Classification Search ............... 307/141, 307/115
See application file for complete search history.

(56) References Cited

U.S. PATENT DOCUMENTS

| 8,129,976 | B2 * | 3/2012 | Blakeley | 323/312 |
| 2003/0227785 | A1 * | 12/2003 | Johnson, Jr. | 363/37 |
| 2010/0278537 | A1 * | 11/2010 | Elberbaum | 398/112 |

* cited by examiner

*Primary Examiner* — Carlos Amaya
(74) *Attorney, Agent, or Firm* — Baker & Hostetler LLP

(57) ABSTRACT

A switch for premises electrical circuits provides wireless control compatible with at least one home automation control system technology. A single switch design can operate two-, three-, and four-way circuits without alteration, and without recourse to coordinating remote switches. The switch includes processor functions for restoring a previous state after power interruption, and for establishing a state commanded during the power interruption. The switch uses two single-pole, single-throw relays for positive safety lockout, and adjusts relay actuation timing with reference to power waveform zero-crossing for contact arc reduction with inductive, tungsten, and capacitive loads.

16 Claims, 8 Drawing Sheets

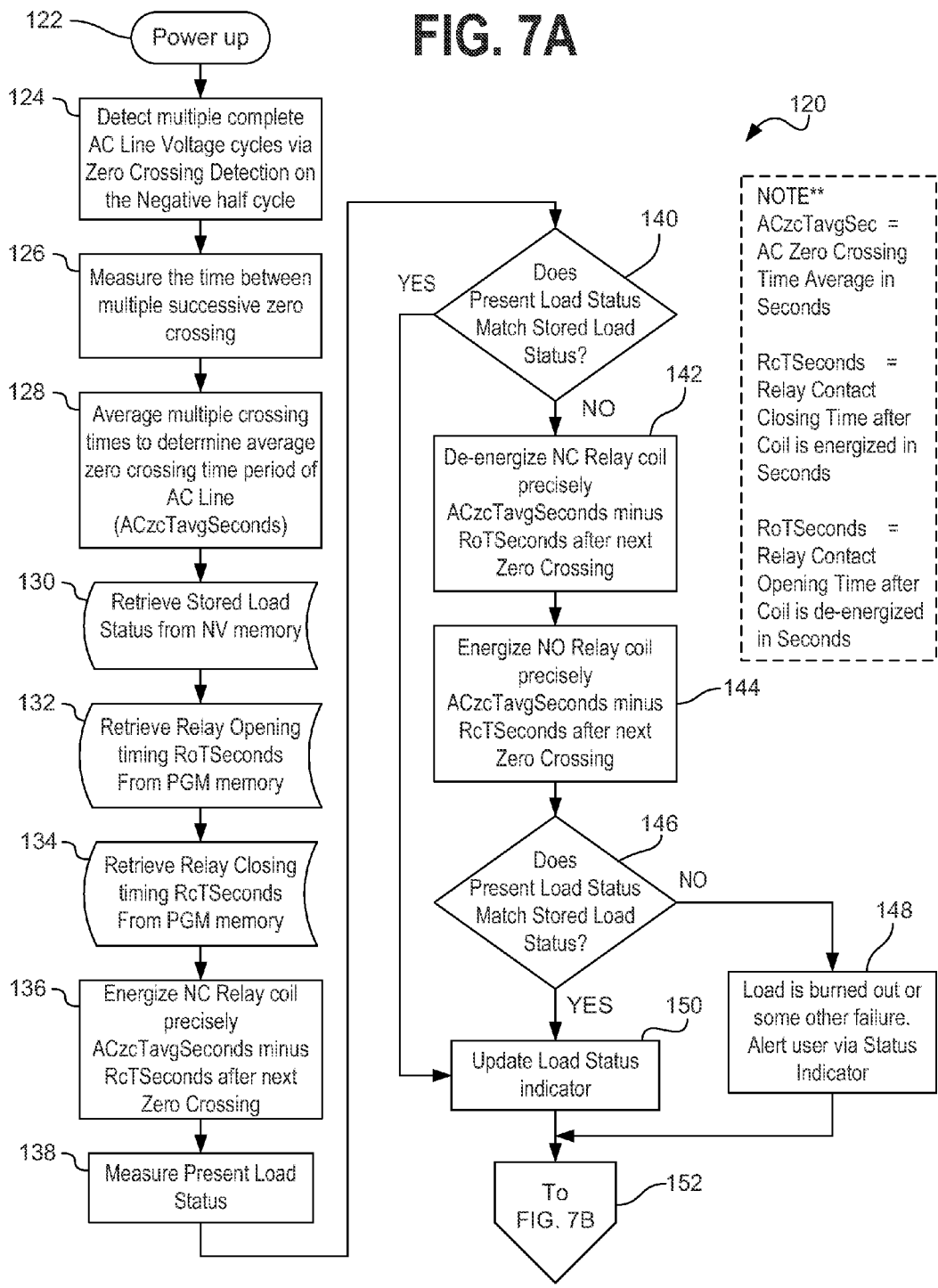

THREE-WAY SWITCH FOR HOME AUTOMATION APPARATUS AND METHOD

FIELD OF THE INVENTION

The present invention relates generally to home automation control functions. More specifically, the invention relates to switching devices compatible with remotely actuated transceiver control.

BACKGROUND OF THE INVENTION

Home automation control systems have established a growing industry and can be expected to persist as controller devices, programming methods, function concepts, and communication technologies advance in capability and decline in incremental cost to market. Particular functions continue to extend capability of existing products, adding and refining convenience, security, safety, and enjoyment features.

What is needed is an apparatus or method that can realize a wall-mount switch adaptable to two-way, three-way, and four-way control within constraints imposed by utility safety regulations for a home automation environment.

SUMMARY OF THE INVENTION

The above needs are met to a large extent by apparatus and methods in accordance with the present invention, wherein a single configuration of wirelessly controllable switch can substitute for a so-called two-way or three-way manually actuated switch in a circuit that controls a premises electrical load in whole or in part. The wirelessly controllable switch can further provide display for its load actuation status, provide manual shutdown of operation in support of electrical component regulations, and perform testing and display of certain circuit faults.

In one aspect of the invention, a remotely-controllable electrical switch is presented. The switch includes a housing having an outer envelope configuration compliant with standards for premises electrical power control devices, a plurality of electrical terminals configured to attach to premises electrical wiring multi-ampere power conductors, and a first single-pole, single-throw relay and a second single-pole, single-throw relay. The respective relays are each configured to conduct multi-ampere electrical power from a common terminal of the plurality of terminals whereto first respective contacts of both of the relays are connected, to respective first and second runner terminals of the plurality of terminals, to each of which a second contact of one of the respective relays is connected. Conduction takes place in response to application of an energization signal to an actuation element of one of the respective relays. The switch further includes a controller having a circuit switching routine that issues a relay deactuation command to deactuate a heretofore-actuated one of the respective relays and, thereafter, a relay actuation command to actuate a heretofore-deactuated one of the respective relays.

In another aspect of the invention, a remotely-controllable electrical switch is presented. The switch includes an insulated housing configured to mount within a standard wall-mount, flush-mount, single-gang electrical wiring box along with associated wiring for two-way or three-way switches, a safety ground terminal, a neutral terminal, a common terminal, and two runner terminals, each configured to connect to at least one solid 12-gauge or smaller copper conductor. The switch further includes an operator interface panel at the wall surface that includes a load status indicator, an air gap switch, and a rocker-style operator switch providing single-pole, double-throw, center-off, momentary-contact functionality, wherein one actuating pole of the rocker switch is located above the other in vertically-mounted orientations. The switch further includes a first single-pole, single-throw, normally-open, coil-driven relay and a second like relay. Each of the relays is configured to conduct multi-ampere electrical power from or to the common terminal of the switch, whereto first respective contacts of the contact sets of both of the relays are connected, to respective first and second runner terminals, to each of which a second contact of one of the respective relay contact sets is connected. Conduction is in the alternative, in response to application of a coil drive signal to one of the respective relays as directed by a controller. Upon initial application of mains power with the air gap switch in its operational state, the controller directs application of a coil drive signal to the relay that would be actuated in response to pressing the lower pole of the rocker switch. Following this initial application, the controller further compares a resulting load state to a previously-stored load state, remains in that state if the load states agree, and reverses to drive the other relay if the load states differ. Coil drive signal application timing includes relay contact making and breaking conduction timing that coincides with zero crossing of the mains power waveform with selected accuracy. Each break in contact conduction by a relay precedes making contact conduction by the other relay by a selected time interval.

In still another aspect of the invention, a method for controlling an electrical circuit in premises wiring is presented. The method includes establishing two substantially parallel electrical paths from a feed-side shared node, electrically proximal to a mains power feed, to a return-side shared node, electrically proximal to a feed-side terminal of a two-terminal load, thence through the load to a neutral-side terminal thereof, wherein the neutral-side terminal of the load is connected substantially directly to a neutral return. The method further includes interposing jointly within the substantially parallel paths, in a serial string, a plurality of manually-operable mains power routing selectors, wherein a first one of the selectors, electrically positioned at a first end of the serial string, functions at least as a divider to establish the parallel paths. The divider includes two substantially matched interruptors, whereof first nodes share a connection to one of the mains power input and the load terminal not connected to neutral, and whereof second nodes are individually connected to the two parallel paths. The method further includes establishing another of the selectors, electrically positioned at a second end of the serial string, that includes a single-pole, double-throw manually-actuated routing selector, whereof respective throws are connected to the two parallel paths, and whereof an electrically common point connectable to the throws in the alternative is further connected to that one of the mains power input and the feed-side terminal of the load whereto the two-interruptor selector is not connected. The method further includes interposing none or any larger number of selectors between the first and second ones, wherein all electrically interposed selectors have double-pole crossover functionality. The method further includes displaying status of the two-interruptor selector on a status indicator component thereof.

In yet another aspect of the invention, a remotely-switchable electrical circuit is presented. The circuit includes a first switch having manual and wireless control capability, having effective single-pole, double-throw functionality using a pair of single-pole, single-throw relays wired together and to a mains power feed at a common terminal, and splitting out, at separate second terminals thereof, into two substantially parallel electrical paths. The circuit further includes a second switch having manual controls and single-pole, double-throw functionality, wherein separate terminals connected to the respective throws of the second switch further connect to the parallel paths, wherein the second switch, in the alternative, connects one of the parallel paths to a first terminal of a two-terminal load, proximal to the feed. A second terminal of the load, distal to the feed, is connected directly to the neutral return. The circuit further includes no manually-operable switches or one or more such switches in a serial string, selecting direct or crossover connection between the parallel paths. The circuit further includes a power supply configured to apply a portion of the feed supplied to the remotely controllable switch, in response to application of an input signal, and further by controller command, to a first magnetically-actuated, momentary-contact relay for closure of a contact pair located therein, connecting the feed to the first path. The circuit further includes, in the alternative, a function configured to apply a portion of the feed supplied to the remotely controllable switch to a second magnetically-actuated, momentary-contact relay for closure of a contact pair located therein, connecting the feed to the second path.

There have thus been outlined, rather broadly, the more important features of the invention in order that the detailed description thereof that follows may be better understood, and in order that the present contribution to the art may be better appreciated. There are, of course, additional features of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments, and of being practiced and carried out in various ways. It is also to be understood that the phraseology and terminology employed herein, as well as in the abstract, are for the purpose of description, and should not be regarded as limiting.

As such, those skilled in the art will appreciate that the conception upon which this disclosure is based may readily be utilized as a basis for the designing of other structures, methods, and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

FIGS. 7A and 7B are a two-sheet flowchart showing the initialization and operation functions of the switch of FIG. 2.

DETAILED DESCRIPTION

Figure 1:
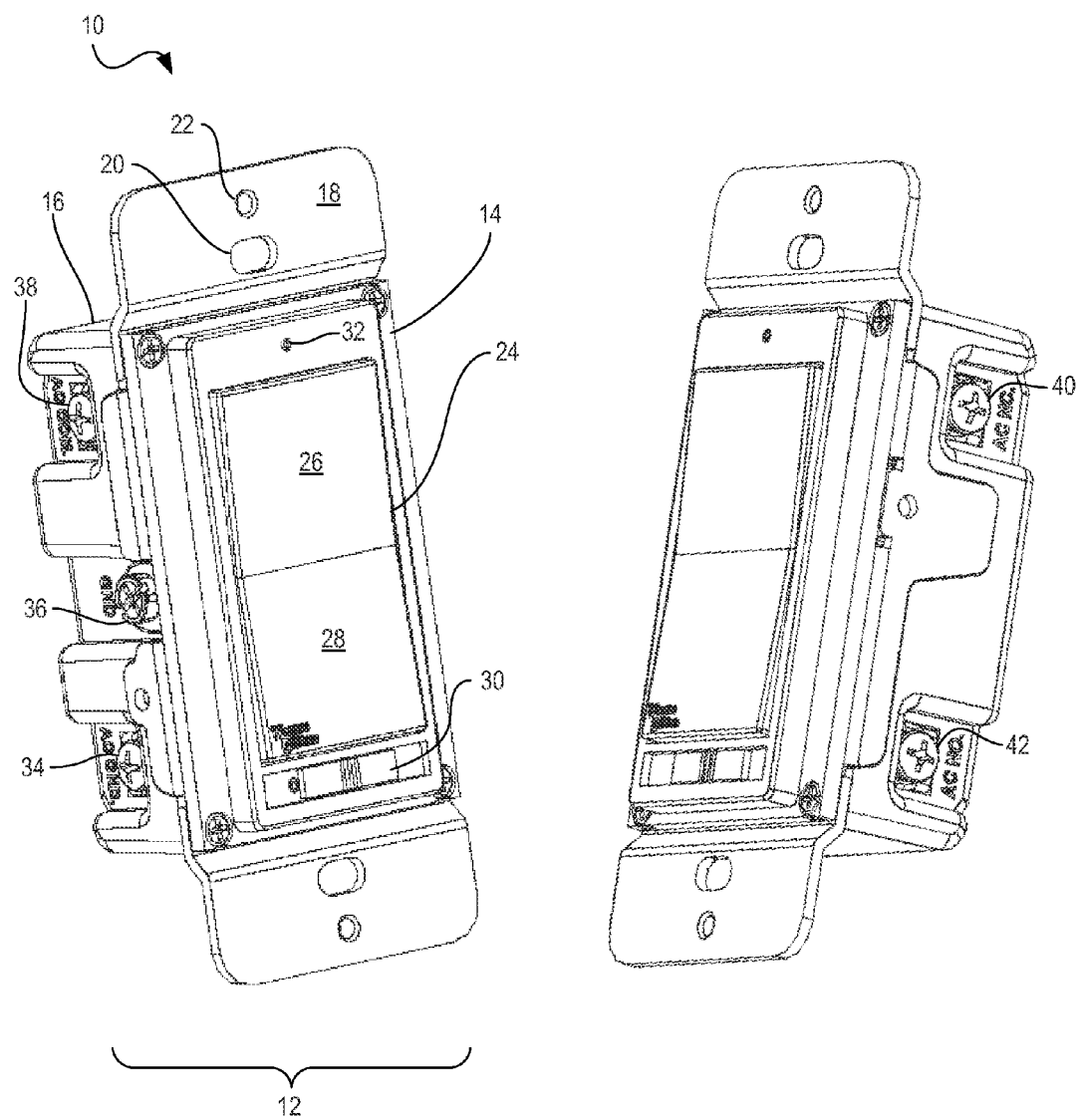
FIG. 1 is a perspective view of a switch according to the present invention, viewed from the right and left sides.

The invention will now be described with reference to the drawing figures, in which like reference numerals refer to like elements throughout. An embodiment in accordance with the present invention provides an electronic switch compatible with installation in two-way, three-way, and four-way circuits in home automation applications, and further provides power-loss memory, post-power-loss state control, load status indication, and an auxiliary air gap switch for safety and conformance to common regulatory requirements. Increased switch life is realized through zero-current and/or zero-voltage switching of electromechanical relays.

It is to be understood that certain terms as used herein conform generally to either their ordinary meanings or to specialized meanings as used in the electrical power distribution trade, in electronic design engineering, or in the specialized area of home automation. "Mains" refers to the electrical power wiring provided to a premises, or to the associated voltage and current thereof, as indicated by context. "Service" and "utility" may be used with substantially equivalent sense to "mains."

FIG. 1 shows right and left perspective views of a switch 10 according to an embodiment of the present invention. The switch includes an outer envelope 12 in multiple component parts 14, 16 capturing between them a yoke 18 that is electrically grounded and provided with two elongated holes 20 for attaching the switch 10 in standard electrical boxes (not shown), two threaded holes 22 for attaching a faceplate (not shown) to the switch 10 after installation in a standard box, a manual actuator in the form of a paddle 24 that uses internal springs (not shown to cause it to return to a center position as shown after the upper or lower face 26, 28 is pressed and released, an air gap switch 30, and a status indicator 32 that presents light from a light emitting diode (LED) functioning as a status indicator (reference numeral 88 in FIG. 2) corresponding to particular states of the internal electronics of the switch 10. Five electrical nodes are made available for connection using screw terminals and marked with raised lettering in the embodiment shown. The respective screw terminals are marked "AC GND." for a neutral node 34, "GND" for a separate safety ground node 36, "AC COM." for a common node 38, "AC NC." for a first runner node 40, and "AC NO." for a second runner node 42. The functions of the respective components are addressed below with reference to their functions in block diagram form in FIG. 2.

Figure 2:
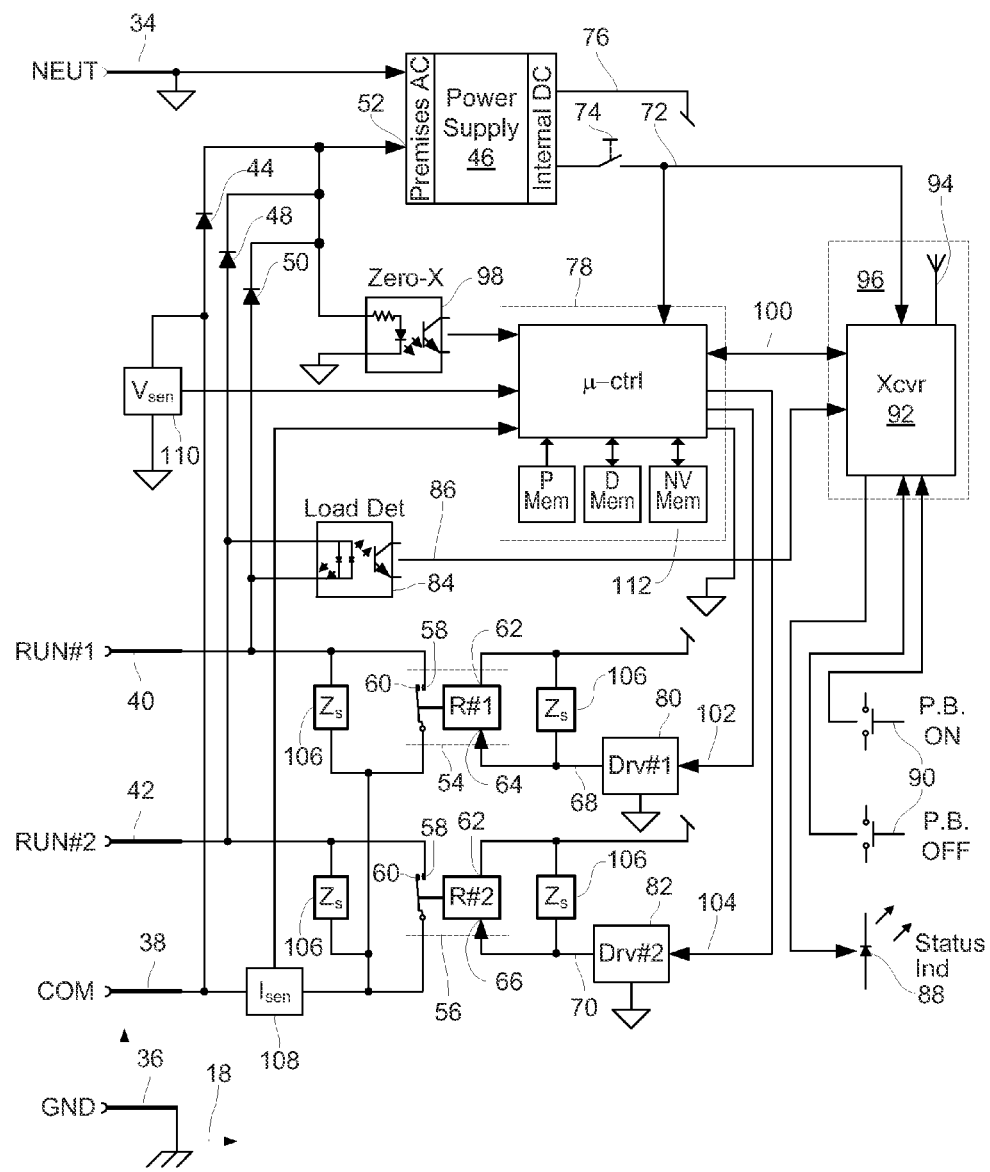
FIG. 2 is a block diagram of a switch according to the present invention.

FIG. 2 shows the switch 10 of FIG. 1 in block diagram form. The electrical connections are repeated, as follows: Neutral node 34 serves as a return path for power consumed within the switch 10. Safety ground node 36 is connected to or is part of a metal mounting bracket structure, the yoke 18, that can be positively connected to corresponding parts of premises wiring external to the switch 10. The node 36 and yoke 18 can be part of a housing making up the outer envelope 12, as shown in FIG. 1, or can protrude through an insulating outer envelope, according to user preference. Common node 38 is connected via a first power isolation and rectification diode 44 to an internal power supply 46 that converts alternating current (AC) power from a municipal supply (mains) or comparable source to voltages and current levels required within the switch 10. Two additional terminals, each functional, as is common node 38, as an input or output node, and denoted herein as first runner node 40 and second runner node 42, are connected to respective rectification and isolation diodes 48, 50. The terminals 38, 40, 42 provide power to the internal power supply 46 in the alternative by way of respective diode anodes, with the cathodes of the three diodes 44, 48, 50 connected to a common input feed 52 of the power supply 46 as shown. As represented in FIG. 2, the three diodes 44, 48, 50 have the same polarization, so that if any of the three receives power with reference to neutral 34, the power supply 46 receives power.

The configuration of FIG. 2 provides half-wave rectification with positive polarity into the power supply 46; a negative-polarity supply using reversed-polarity diodes would also require reconfiguration of a typical power supply 46. Bridge rectification configuration is likewise practical, but bridge or any other style of full-wave rectification provides limited benefit beyond reduced need for switch noise filtering in a lightly-loaded power supply 46 with roughly 120 V RMS input, which is the preferred embodiment.

The switch 10 further includes two single-pole, single-throw relays 54 and 56. The respective relays 54, 56 provide alternate conduction paths between the common node 38 and one of the runner nodes 40, 42 when conduction between first and second contacts 58, 60 of relay 54 or 56 is activated. As shown, a relay common high-side terminal 62 is connected to internal relay power 76. Relay activation takes place by applying an energization signal between a low-side terminal 64, 66 of one of the respective relays' actuation elements, hereinafter coils, and the neutral node 34.

The outer envelope configuration may be required to comply with certain regulations; standards established for premises electrical power control devices by the National Fire Protection Association (NFPA), such as the National Electrical Code (NEC, NFPA Document No. 70), or by other standards bodies, may have force of law in some jurisdictions. In some preferred embodiments, the outer envelope has the form of a self-contained enclosure having dimensions and mounting arrangements in conformance with NEC for wiring and installation within a likewise-conforming single-gang, flush mountable wiring enclosure for premises electrical wiring. The NEC includes positioning and strength of mounting ears (yoke 18), size and other properties of terminals/nodes, and other details of switch construction.

Both coil drive paths 68, 70 can be positively disabled, in conformance to the NEC or other standards addressing remotely actuated premises wiring devices. This can be realized in any of several ways. For example, in some embodiments, the integrated circuit power signal 72 can be routed through an air gap switch 74, as shown in FIG. 2. This permits disabling of all active electronics, and with it the disabling of drive to both relays 54, 56. In a representative alternative embodiment, the single electrical path between the common terminal 62 of the coils and the power supply relay-drive output 76 can be routed through the air gap switch 74 instead of the logic disable shown. Each such embodiment permits positive disabling at least of both coils with an air gap switch 74 having low actuation effort, relatively low cost, and moderate power capability—adequate to actuate and to hold one relay coil at a time, indefinitely, but not required to carry the full rated capacity of the switch 10. In other embodiments, equivalent functionality can be realized with a logic-grade air gap switch—that is, a switch with one or more poles, rated for switching of logic-level signals. Such a switch can be configured to apply a disable signal to a microprocessor-based controller, shown as a control block 78, or to coil driver units 80, 82, the latter either jointly (requiring one air gap switch pole for the switch) or individually (requiring one air gap switch pole per driver, inserted in the respective driver input signal paths 102, 104 from the control block 78 or another effective point). In some embodiments, subject to regulatory approval, air gap switch 74 poles can be configured to disable specific return path connections to the neutral node 34, such as from the power supply 46, the control block 78, the drivers 80, 82, or a plurality of parts of the switch 10, or from the power supply 46 to any part or parts of the switch 10 that use power, shutting down the switch 10 with user-selected redundancy.

Power supply 46 logic-level output power 72 is fed to the control block 78. The control block 78 further has a circuit switching routine in the form of stored instructions, enabling the control block 78 to issue commands to deenergize a heretofore-energized one of two coil drivers 80, 82, and thereafter to energize the heretofore-deenergized one thereof, thereby transferring actuation from one of the relays 54, 56 to the other. Timing for these operations is addressed below.

An additional functional block combines a Z-Wave® (© ZenSys® Corp.) specification compliant information and communication processor and transceiver 92 and its associated antenna 94, typically as a component module 96. A module 96 compatible with another use and at least in part with the use described herein is disclosed in U.S. patent application Ser. No. 12/191,912, filed Aug. 14, 2008, incorporated herein by reference in its entirety, and referred to hereinafter as '912. A command signal, transmitted to a circuit controlled by a switch 10, and received through the Z-Wave module 96, can provide command functionality at least equivalent to the manual actuation switch 90 in the forms described above. A module 96 compatible with the functionality described in '912 can further search in its transmitting and receiving range for other such modules and acquire and store their addresses, as well as receive and reply to polling requests for system status.

As discussed in '912, Z-Wave transceiver 92, and potentially wireless control modules using alternative technologies, can contain appreciable processing power, fixed and alterable storage resources for programming instructions and configuration data, and interface functionality. Such a resource can be configured to function as the processor for a switch 10 in place of the separate control block 78 shown in FIG. 2, or to share such tasks. For clarity of exposition, the present description treats control block 78 and its internal functions as separate from the switch's transceiver 92 and antenna 94 group, of which a Z-Wave module 96 may be representative. Thus, the configuration presented herein should not be viewed as limiting.

The Z-Wave module 96 further accepts a command signal from a physical actuation switch 90, located at a user-accessible surface of the switch outer envelope 12, shown as the paddle 24 in FIG. 1. The actuation switch 90 can be of any style suitable for commanding a switch-type input to the Z-Wave module 96, such as a single pole, single throw (SPST) electromechanical (EM) switch that can be detected positively in one position and by absence of the closed circuit in the other position. In the alternative, a single pole, double throw (SPDT) momentary (center off) EM switch, or a pair of discrete, momentary SPST EM switches, as shown, is likewise readily implemented. The latter types permit a user to always press the "up" side 26 of a rocker actuator (paddle) 24, as shown in FIG. 1, for example, to turn the controlled circuit on, and the "down" side 28 to turn it off. Such optional capabilities are not readily realized with double-throw switches lacking center-off and momentary actuation features. Similarly, because the switch 10 typically receives mains power before user actuation of the physical switch 90, non-EM styles such as capacitive and piezoelectric transducers that detect transient pressure or impedance changes, with or without perceptible physical motion of the paddle 24, may be used. Since the actuation switch 90 is not required to carry the principal load current of the switch 10, these and other configurations can be adequate to provide input to the Z-Wave module 96 as shown, or to the control block 78, and should not be regarded as limiting.

In the embodiment shown in FIG. 2, the Z-Wave module 96 functions as the manual-switch-closure, transceiver-signal, load-sense, and load-status-indicator (LED 88) control interface, and passes state commands to the control block 78 through a command line 100 signal connection. The control block 78 manages relay actuation and timing with reference to the mains power zero crossing sense 98 and air gap switch 74 status.

FIGS. 3-6 are beneficially considered at this point to establish terminology for further discourse.

Figure 3:
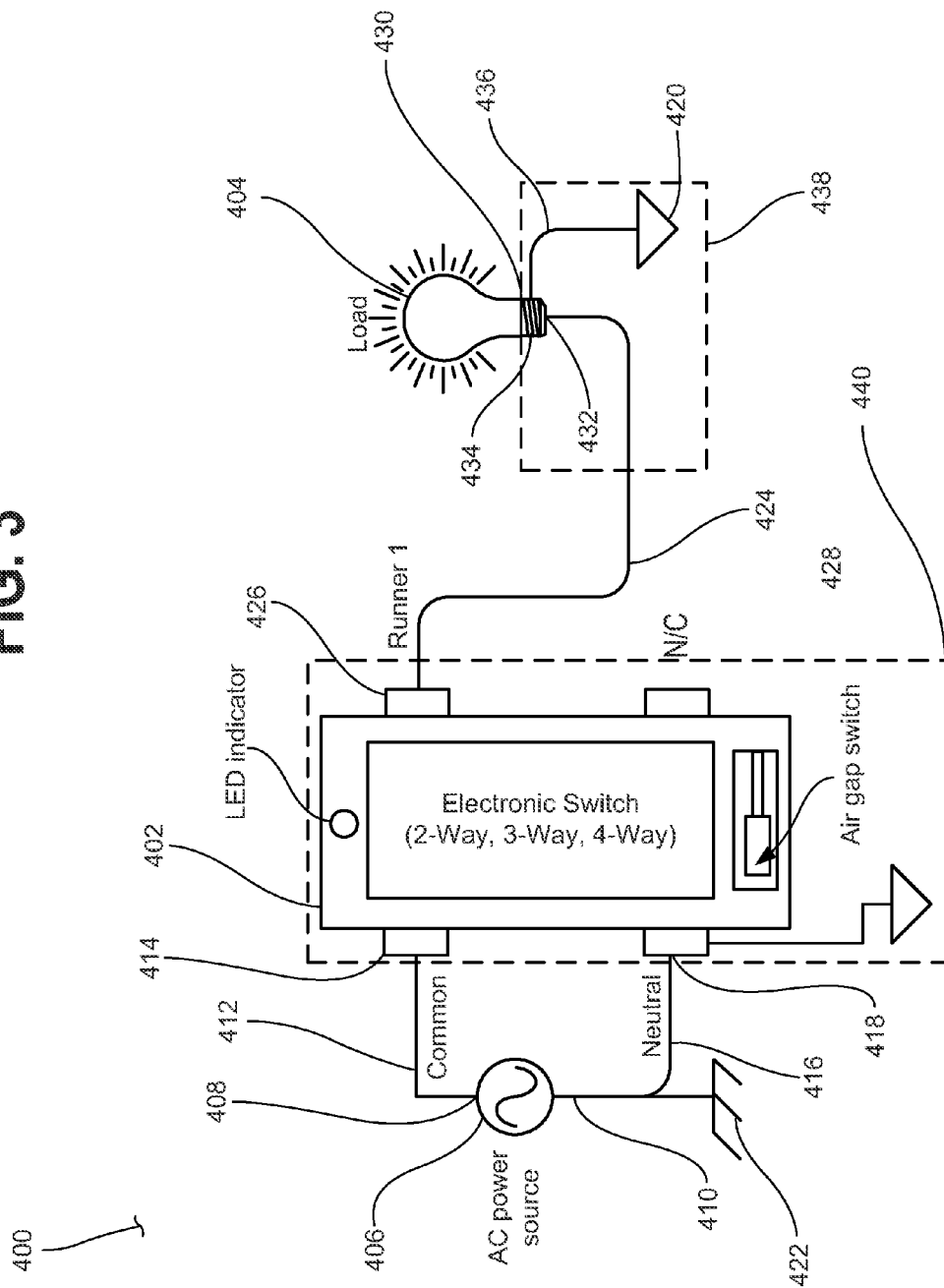
FIG. 3 is a schematic of a two-way switch circuit in a home automation system that includes a switch in accordance with the present invention.

FIG. 3 shows a simple, so-called two-way (i.e., on and off) circuit application 400 with a single switch 402 and a single load device 404. Standard representation shows a single-phase alternating current (AC) power source 406 having a hot side 408 and a neutral side 410. In practice, such an AC source 406, also referred to as mains, generally originates from a municipal supply and is distributed first to a premises, then to individual circuits 400, by way of a circuit breaker box and its associated distribution wiring (not shown), which are jointly viewed as a boundary of the premises. From the source hot side 408, a wire herein designated common 412 is connected to a common node 414 of the switch 402, while from the source's neutral side 410 a wire designated neutral 416 is connected to a neutral node 418 of the switch 402.

It should be noted that premises wiring maintains, by largely-universal regulation, an additional "safety" ground wire, generally not shown in the figures herein, that connects to the AC power source grounded side 410 at a single common point, generally the point at which municipal wiring enters the premises, and that carries no current in fault-free operation. The neutral lines 416 used throughout a wiring installation lead back to—and connect to—this common point, but are intended to carry current when loads are active. For simplicity, the physical wires associated with neutral lines 416 may be represented herein by inverted-triangle ground symbols 420, distinct from the symbol for AC source ground 422, represented herein by three parallel diagonal strokes descending from a bridging stroke.

FIG. 3 further shows a wire known at least in premises wiring parlance as a runner 424, connected to a first runner node 426 of the switch 402. In a two-way circuit as shown, a second runner node 428 of the switch 402 is unused. The runner 424 is routed to the load 404, represented here by an incandescent lamp, with the runner 424 connected by way of a lamp socket 430 to the load hot node 432 (the center terminal of the lamp socket 430), and the load neutral node 434 (the outer terminal of the lamp socket 430) connected to a second neutral wire 436. As noted, the second neutral wire 436 would in practice be routed along with the runner 424 from an electrical box 438 associated with the load 404 to another electrical box 440 associated with the switch 402, and then back to the AC source 406. As indicated in FIG. 3, the second neutral wire 436 is connected to the first neutral wire 416 and to the switch 402 at the neutral node 418 of the switch 402.

In a first class of alternate circuit configurations, the switch 402 can be reversed, with runner 424 connected to the source hot side 408 and common wire 412 connected to the load hot node 432. In a second class of alternate circuit configurations, the runner node 428, shown as unused, can be connected, in lieu of runner node 426, via runner 424 to the load hot node 432, with common wire 412 connected to the source hot side 408. Likewise, runner node 428 can be connected via runner 424 to the source hot side 408, with common wire 412 connected to the load hot node 432. This second class of alternate circuit configurations is not preferred in the embodiments discussed herein, because the logic design calls for the runner node 426 to be deactuated and for the runner node 428 to be actuated each time power is applied to the circuit, and a preferred use provides for the load to be deenergized when power is applied. In other embodiments, such as ones wherein a load state existing prior to power loss is restored after power restoration, the various alternate circuit configurations can be operationally equivalent.

Figure 4:
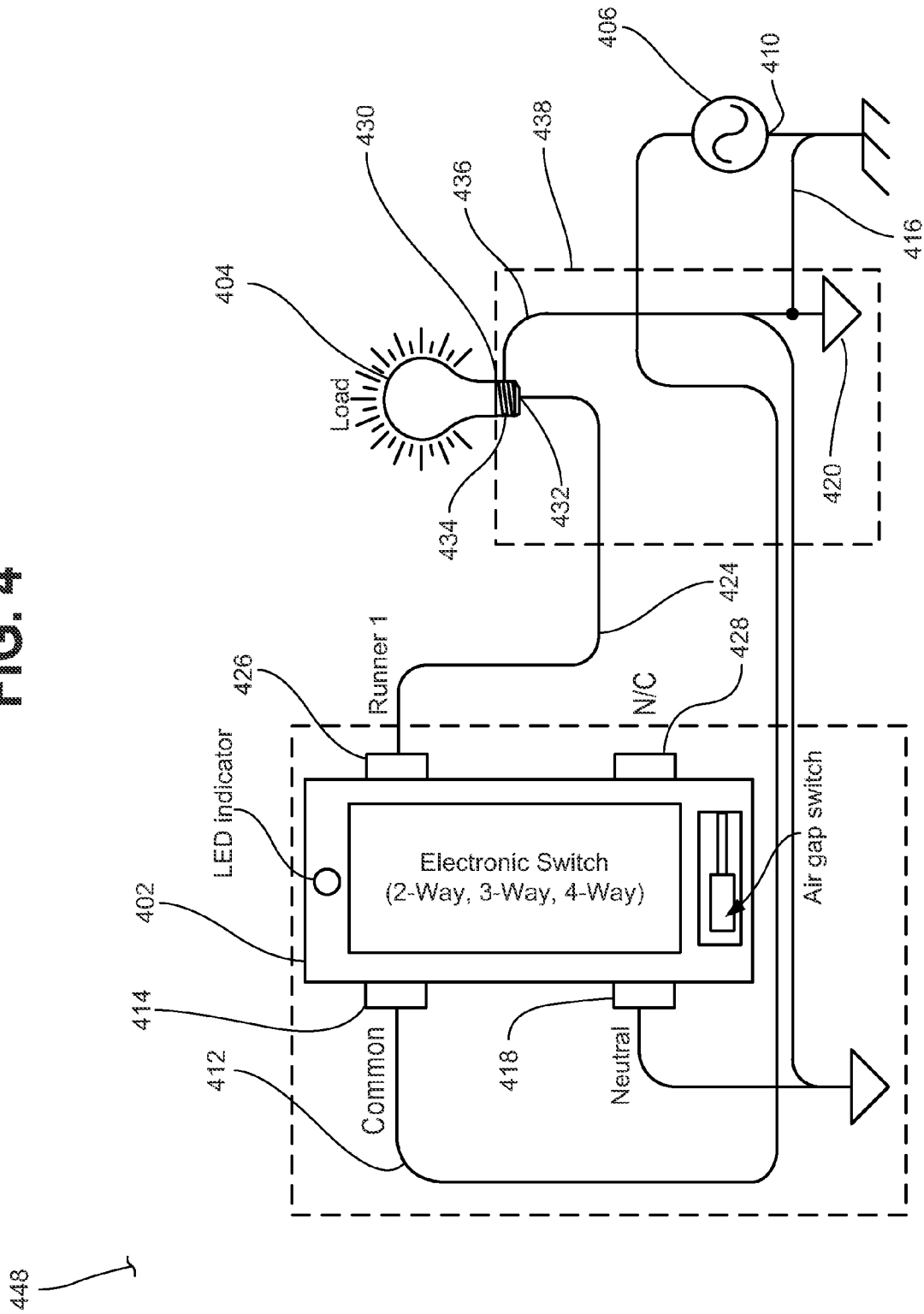
FIG. 4 is a second two-way switch circuit that includes a switch in accordance with the present invention.

FIG. 4 shows another arrangement 448 for premises wiring of a single switch with a load. Premises wiring is strictly constrained by regulations and guidelines in most venues. While FIG. 3 shows permissible applications wherein the switch 402 is electrically closer to the source 406 than is the (single-component) load 404, a second class of applications permits one or more parts of the load 404 to be electrically closer to the source 406 than is the switch 402. Regulations characteristically require that any load 404 have a neutral terminal or node 434 directly wired to the source neutral side 410. Thus, if the switch 402 is distal to the source 406, two wires are routed from the load 404 to the switch 402 for load hot node 432 operation, and a third to connect the switch neutral node 418 as required for operation of the electronics within the switch 402. FIG. 4 is representative of the permutations for connecting the switch 402 and is not intended to be limiting. Split loads, wherein the switch is proximal to the source, distal to the source, or intermediate between the parts of the load, can be configured using the examples shown in FIGS. 3 and 4 and in published regulations, provided the common wire 412 is used along with only one runner node 424, and that a neutral wire 416 or equivalent feed to the switch 402 is provided.

Figure 5:
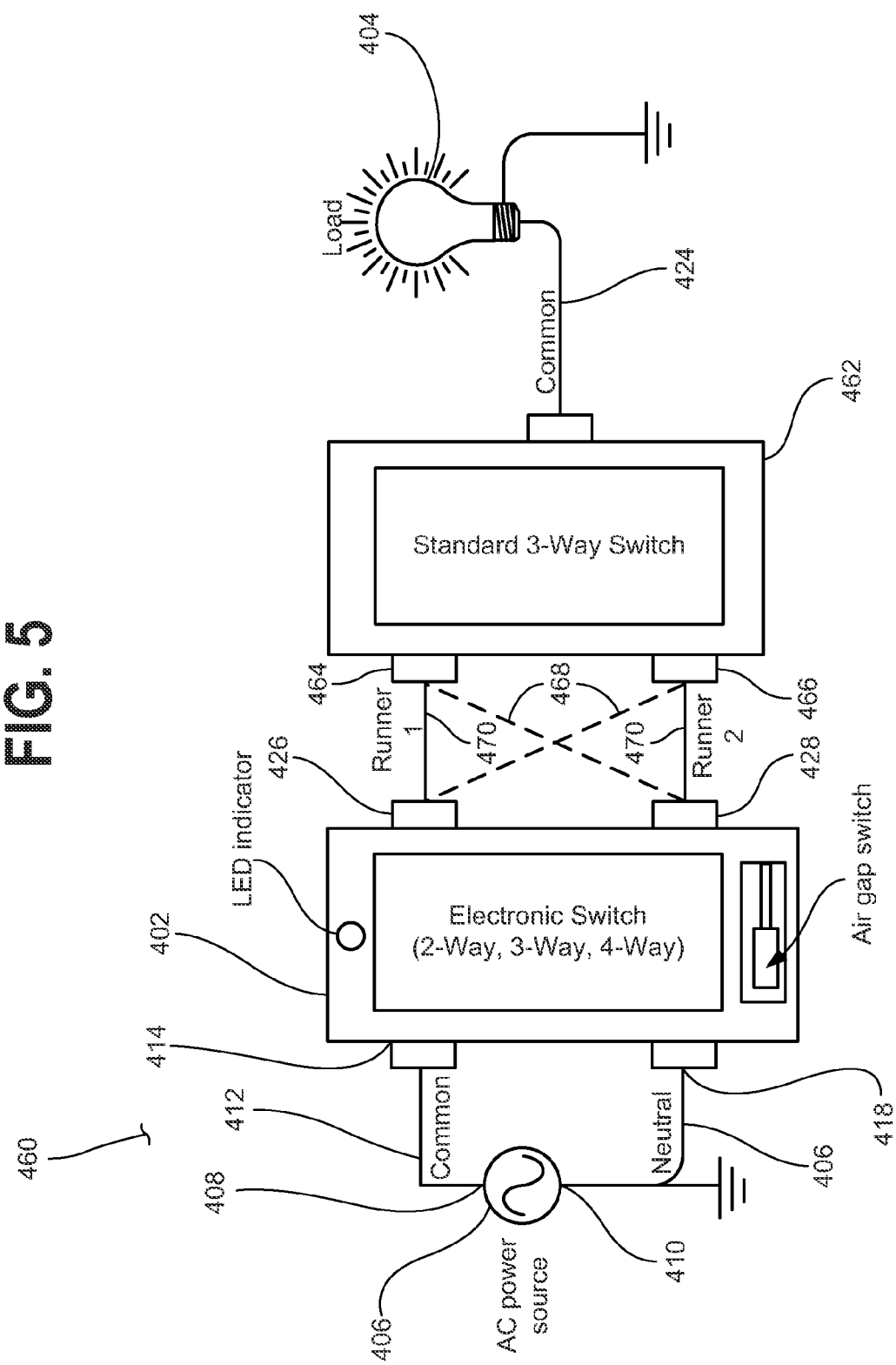
FIG. 5 is a three-way switch circuit that includes a switch in accordance with the present invention.

FIG. 5 shows the same switch 402 in a so-called three-way application 460, wherein two switches 402, 462 and a single load 404 are wired in a single circuit powered from a single source 406. This allows either switch 402, 462 to operate the load 404, with any one state change in either switch 402, 462 reversing the state of actuation of the load 404. As in other three-way switch applications, the runner node 426, 428, 464, 466 connections can be wired diagonally (dashed lines 468) or directly (solid lines 470), although they must be electrically isolated from one another. The common node 414 of the first switch 402 is routed to the source hot side 408, and the neutral node 418 of that switch 402 is routed to the source neutral side 410 in the wiring arrangement shown in the application 460. The wiring arrangement shown is one of several allowable under typical NEC guidelines and local ordinances. As in the cases illustrated in FIGS. 3 and 4 for a single switch 402, the source 406 may be presented first at the load 404 or at one of the switches 402, 462. The load 404 may be split into multiple parts, consistent with NEC guidelines.

It should be observed that either of the locations shown may house a remotely-controllable switch 402. Because signal communication between the remotely-controllable switch 402 and remote controllers can be dependent on propagation characteristics in an environment, it may be preferable to select one or another placement for the remotely-controllable switch 402 in view of system functionality. This attribute—position-independence for the remotely-controllable switch—is distinct from the properties of the existing art, wherein a first switch receives a special power feed and a second switch used to realize a three-way circuit is a unique, non-remotely-controllable switch type that must be "downstream" from the first switch and wired uniquely from other NEC-approved work.

Figure 6:
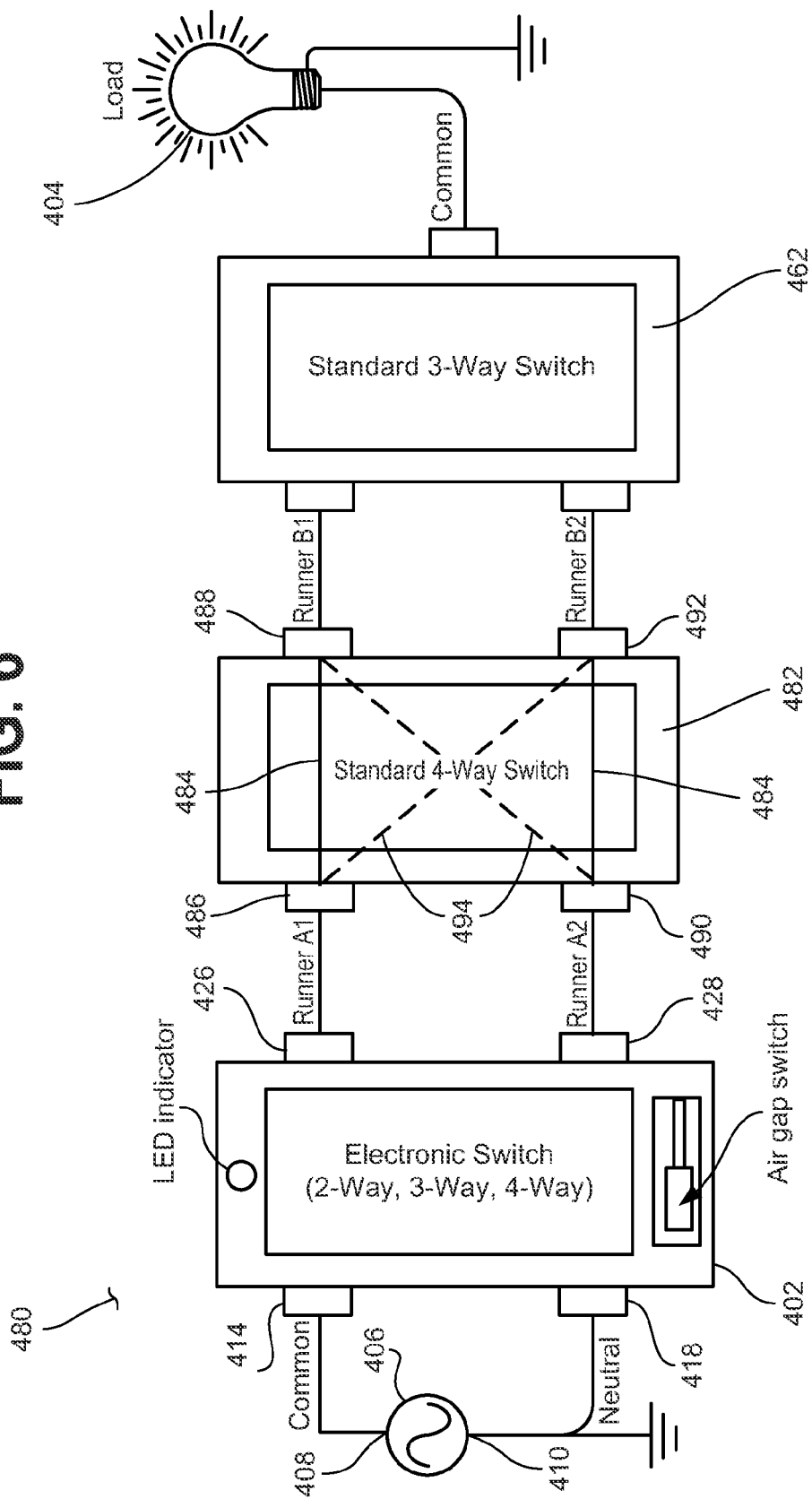
FIG. 6 is a four-way switch circuit that includes a switch in accordance with the present invention.

FIG. 6 shows an example of a four-way application 480, wherein two three-way compatible switches 402, 462—at least one of which is a remotely-controllable switch—have interposed between them a single so-called four-way switch 482. A four-way switch 482, as the term is used in premises wiring, is a mechanical switch for electrical circuits that has a first rest state (solid lines 484) wherein a runner A1 node 486 has continuity to a runner B1 node 488 of the switch 482, while a runner A2 node 490 has continuity to a runner B2 node 492 thereof, and a second rest state (dashed lines 494) wherein runner A1 node 486 has continuity to runner B2 node 492 thereof, while runner A2 node 490 has continuity to runner B1 node 488 thereof. As in the above three-way configurations, reversing the state of any one switch 402, 462, 482 reverses the power state of the load 404. It is noteworthy that any number of additional four-way switches can be interposed in series with the four way switch 482 shown, between the three-way switches 402, 462, and the functionality of reversing the power state of the load 404 as each of the switches is flipped is not changed. Relocating the source 406 and relocating or splitting the load 404 as in the three-way and two-way applications described above, consistent with NEC guidelines, likewise retains this functionality.

In four-way applications, the remotely-controllable switch 402 is of the same design as those used in the two-way and three-way applications. The switch is located at one or the other end of the string of switches at user option, and requires both a mains power feed and a mains neutral feed. The mains power feed originates from the source hot side 408, is routed through the application circuit as needed, and connects to either the switch's common 414, or alternately to the first runner 426 and second runner 428, toggling as the other switches in the circuit flip. The mains neutral feed originates from the source neutral side 410, is routed through the application circuit as needed, and connects to the neutral node 418 of the switch 402.

Returning to FIG. 2, activation of an electrical load by an installed switch 10 requires that current flow from a mains power source, through energized contacts on one of the relays 54, 56, through any other switches in a 3-way or 4-way circuit if so configured, and through a load 404, as shown in FIG. 5, for example, to neutral 410. Under this circumstance, the load-carrying runner 464 or 466 is at mains power potential, for any permitted wiring arrangement. The non-load-carrying runner 466 or 464 is floating in that state. Without separate connections from the respective runners 464, 466 to opposite mains power feed rails, no differential exists between the nodes, and the load detector 84 is not excited. A no-excitation value on the signal line 86 from the load detector 84 to the control function—this portion of the control function is located in the transceiver 96 in some embodiments—can be interpreted to signify that a load is drawing power. The transceiver 96 can be programmed to activate a load status indicator 88 in response to this. All other circuit configurations (FIGS. 3-6 and other allowed 2-, 3-, and 4-way configurations) for the switch 10 embodiment shown in FIG. 2 likewise deactivate the load sense output optotransistor when drawing load current, allowing the same transceiver 96 programming of the load status indicator 88 to be used for wiring configurations that conform to U.S. and most international wiring standards.

In the alternative, if the switch 10 is installed in a 2-way circuit and is in its NC state, or is installed in a 3- or 4-way switch string in a net nonconducting state, then one of the two runners 464, 466 carries the mains power signal while the other is carried to neutral through the load resistance, and the load detector 84 output optotransistor is activated. This applies the opposite state to the transceiver 96 load detector line 86 input, disabling the load status indicator 88.

In the event no load is connected, such as lamp burnout, no excitation can occur, and the load status indicator 88 is activated for both positions of any switch in the string despite a user-perceived lack of actuation. This describes a programming arrangement operable for the embodiment shown. In another such operable programming arrangement, load detector 84 status with each relay 54, 56 actuated can be stored in memory, and the results compared to determine whether there is a complete circuit with an installed load. Such a programming arrangement can, for example, cause the load status indicator 88 to be set to flash, or cause a load-fault status signal to be transmitted to a remote controller. Other programming arrangements are also anticipated; those listed here should not be viewed as limiting.

The form of load detector 84, shown herein as a cross-connected pair of light emitting diodes (LEDs) optically coupled to an optotransistor, is likewise not intended to be limiting. Note that a typical implementation for such embodiments would include a current limiter such as a resistor in series with the diodes and a logic signal developer such as a pullup resistor on the output of the load detector 84. Other forms of load detectors, positioned on the common line 38, may include, for example, a single Hall effect device, current transformer, or shunt in the form of a four-terminal resistor, each with an associated isolation amplifier or related circuit scaled to provide opposite states of a logic signal for load current above and below a selected threshold, or providing an analog signal convertible by an A/D converter function in the controller 78 or transceiver 92. Alternate configurations can include variations on such sensors connected between the runners 40, 42. Current sensing devices may be configured in pairs, with one on each of the respective runners, should comparative values be preferred.

A zero-crossing detector 98 can provide a signal to be applied to an input line of the switch control block 78, providing a zero crossing indication when referred to the neutral node 34. More explicitly, zero crossing is the moment in each half-cycle (specifically the end of the positive half-cycle in the embodiment shown) at which the mains power waveform reaches/crosses zero volts. At this instant within a mains power waveform, a purely nonreactive load draws no current, and no voltage differential exists to cause arcing between the relay contacts 58, 60. In some embodiments of the switch 10, the zero crossing detector 98 output signal is preferably available within about +/−15 degrees of zero crossing, and can provide consistent output timing with reference to zero crossing. This can provide timing precision sufficient to protect the relay contacts and extend switch life appreciably, provided the relay contact making and breaking events can likewise be timed consistently.

Timing thresholds other than literal zero crossing are likewise usable for generating timing signals, provided such thresholds are repeatable and well characterized. An optocoupler 98 connected between half-wave rectified mains power and neutral, as shown, can cut off its output transistor at a highly repeatable time proximal to zero crossing to generate a logic output signal, and do so beneficially with minimal additional components. Other zero-crossing sense methods are likewise readily implemented; the indicated embodiment should not be viewed as limiting.

FIG. 7A is a functional flow diagram (flowchart) 120 of a portion of the control logic distributed between the control processor 78 and the transceiver 92 controller of FIG. 2. For brevity, in the discussion that follows, these two controller functions are referred to jointly as "the controller 78/92," and memory locations are referred to without indicating physical placement, although distinctions between program, volatile data, and nonvolatile data are made. Present controllers may not require separate devices for memory, instead including memory blocks along with digital and analog circuitry in shared envelopes. Further, as has been noted, the use of two separate processors as shown is optional with other embodiments using a single processor for all functions including the transceiver function.

Upon installation of a switch 10 and subsequent application of mains power 122, the controller 78/92 captures 124 a succession of zero crossing 98 events, counting 126 the number of clock cycles between them, and averaging 128 the counts to provide an estimate of expected mains power cycle period. This value, preferably stored in a volatile register, need not be stored in nonvolatile (NV) memory as it will be refreshed periodically, and will not be restored after power loss in the embodiment shown.

Following mains power period measurement, the controller 78/92 retrieves the load status 130 from NV memory, and the opening timing 132 and closing timing 134 from program memory. The latter two are characteristic properties of the relays in the preferred embodiment, and are thus programmed into the switch 10. In other embodiments, the values may be measured for each relay, and thus unique to and programmed into each production unit. In still other embodiments, relays in a single unit may be found to differ sufficiently to justify accommodation, in which case the instruction sequence in program memory may include turnon and turnoff values for each, and use the relevant one for each state change. In yet other embodiments, the times may be measured periodically by the controller 78/92 and the revised values stored to and recalled from NV memory rather than program memory.

Next, continuing initialization, the controller 78/92 calculates the turnon wait time (subtracting the characteristic actuation delay time from the measured average mains power waveform period and transferring the remainder to a downcounter), waits until the next zero crossing, counts the preloaded remainder value down to zero, and applies a turnon signal to the NC relay (relay #2 56 in FIG. 2). This makes contact between the common terminal 38 and runner #2 (NC) 42, the default connection for single-switch applications. Finally, since an initial load status has been established by this turnon of the NC relay 56, the controller 78/92 detects 138 this initial load status by reading the load detector 84.

The controller 78/92 then compares 140 stored and present load status. If they differ, then the controller 78/92 performs 142 the corresponding deenergization sequence, namely calculating the turnoff wait time (subtracting the characteristic deactuation delay time from the measured average mains power waveform period and transferring the value to a downcounter), waits until the next zero crossing, counts the preloaded remainder value down to zero, and applies a turnoff signal to the NC relay (relay #2 56 in FIG. 2). It then performs 144 the corresponding turnon sequence for the NO relay. The controller 78/92 then performs another load status test 146. If the mismatch persists, then a fault condition exists 148, such as a burned-out or fully disconnected load. A fault can be managed by causing the status indicator to flash, transmitting wireless error status messages to an external controller, or the like. In a simple fault management mode, operation continues with or without a load status update, and the user can take note of the fault. If the user attempts to force load status to either state, the absence of a light (for example) or the persistence of the opposite of the forced state with repeated commands to change can be used as confirmation of the fault condition. Restoration of the load can restore normal operation.

Returning to step 140, the load status can agree with the stored status—that is, either the NC path energizes the load, or the load was deenergized prior to loss of power. In those cases, the load status value in NV memory can be refreshed 150 (albeit redundantly) and operation can continue 152 onto the second sheet of FIG. 7. Similarly, in step 146, if automatic toggling of the switch 10 to the NO state during initialization corrected the discrepancy, then the same NV refresh 150 and continuation 152 obtain.

Figure 7B:
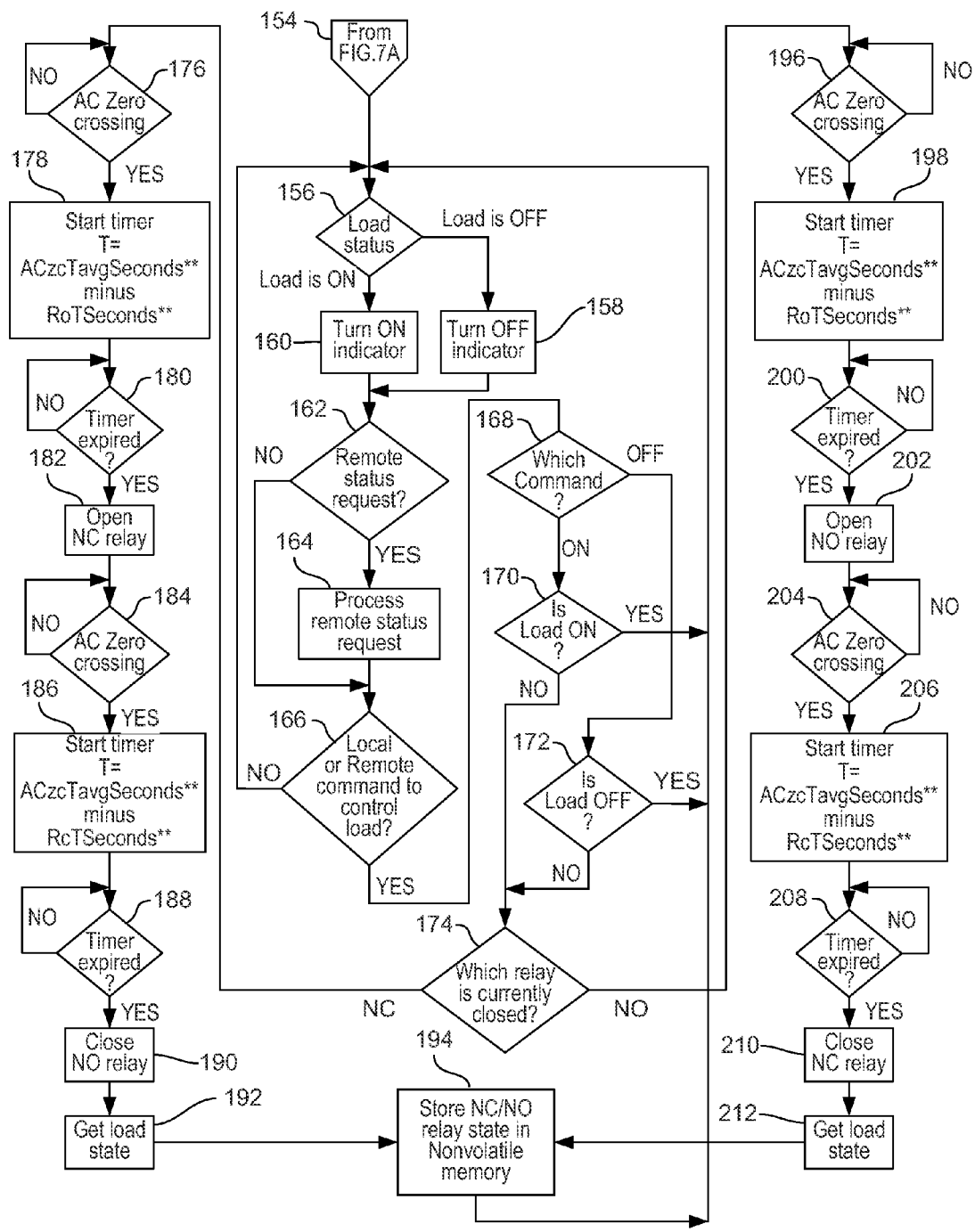

FIG. 7B describes normal operation of the switch 10 following the function of FIG. 7A. This includes detailed enumeration of the functions summarized in blocks 124, 126, and 128 for calculating timing and the following blocks for performing switching.

Continuing 154, load status is again sensed 156. If the load is sensed to be off, then the status indicator is turned off 158, and if on, the indicator is turned on 160. This function serves to assure that the load status remains in agreement with the indicator, but the "tight loop" configuration shown should not be viewed as limiting.

In normal operation as shown, the above-referred "tight loop" further includes testing 162 whether a status request from a remote control device is pending and executing 164 any such pending operation. Continuing, the loop includes testing 166 for existence of a pending load control command, determining 168 whether the command calls for the load to be turned on or off, and, if the load is already on 170 or off 172, respectively, aborting the loop. If the command calls for toggling the switch, then the loop tests 174 whether the start state is NC or NO. In each of these cases, a function approximating those described above, in steps 142 and 144, is followed.

Switching from NC to NO, the transfer begins by waiting 176 for mains power zero crossing, followed by starting 178 transfer by recalling the averaged mains power period, subtracting the characteristic turnoff time, and beginning counting down. A tight loop waits 180 for timeout, then a deenergization signal is output 182 to the NC relay. The transfer continues by waiting 184 for another mains power zero crossing, followed by starting 186 transfer by again recalling the averaged mains power period, subtracting the characteristic turnoff time, and beginning counting down. Another tight loop waits 188 for timeout, then an energization signal is output 190 to the NO relay. After this, the state of the load is verified 192 and stored 194.

If switching from NO to NC is required, the transfer begins by waiting 196 for mains power zero crossing, followed by starting 198 transfer by recalling the averaged mains power period, subtracting the characteristic turnoff time, and beginning counting down. A tight loop waits 200 for timeout, then a deenergization signal is output 202 to the NO relay. The transfer continues by waiting 204 for another mains power zero crossing, followed by starting 206 transfer by recalling the averaged mains power period, subtracting the characteristic turnoff time, and beginning counting down. Another tight loop waits 208 for timeout, then an energization signal is output 210 to the NC relay. After this, the state of the load is verified 212 and stored 194.

In both cases, the loop then returns to reading load status 156 and repeats. This loop permits straight code to be executed without reliance on interrupts. Remote and manual commands applied in this configuration by the transceiver 92 and applied as static state inputs allow programming for both the controller 78 and the transceiver 92 to have relatively low complexity.

In other embodiments, a user may elect not to store a previous load state, such as in nonvolatile memory, but instead to force the switch 10 into a predetermined load state, such as circuit conduction off, without regard for the load state prior to power loss. Similarly, the user may elect to restore the pre-power-loss load state without regard for operator change of the position of other switches in a circuit. These and other embodiment variations can be realized by alterations in programming applied to the controller 78/92, and should not be regarded as limiting.

Relay contacts 58, 60 serving AC inductive loads may also benefit from transient suppression networks, also referred to as snubbers 106, with the snubbers 106 typically incorporating resistors, capacitors, diodes, and/or varistors in some embodiments. Such networks, placed in shunt to the load or in shunt to the contacts 58, 60 as shown in FIG. 2, can largely offset an inductive load during contact opening, keeping arcing low. Snubbers 106 can be significantly load-specific, so capacitor and resistor values and diode ratings, as well as circuit configuration, are preferably selected with a view to likely load properties. Typical snubbers 106 have little effect on capacitive loads, so that contact stress from capacitor inrush is not significantly decreased by such circuit additions. Relay timing is preferably selected to approximate contact closure and opening at zero crossing. Comparable snubbers 106—possibly as simple as shunt diodes across the coil terminals, reverse biased when the coils are actuated—may be applied to the coils of the relays 54, 56 to suppress reverse voltage transient stress on the drivers 80, 82 during shutoff.

It is to be understood that the above-described dynamic alteration of timing of relay coil driver 80, 82 turnon and turnoff with reference to mains power voltage and current waveform zero crossings may be combined with snubber-based transient suppression 106 to further reduce component stress.

Flipping a switch other than the inventive switch 10 as assembled into a three- or four-way configuration while mains power is unavailable can leave out-of-date state data stored in nonvolatile memory 112, shown in FIG. 2. Subsequent power restoration can include recognition by the inventive switch 10 of the configuration discrepancy. In some premises applications, such events can be managed by reestablishing the pre-loss state of the inventive switch 10 (both relays 54, 56 will start in the disengaged state if the power interruption is long enough to permit the active coil to release). For example, if a switch in a 3- or 4-way string is flipped during a power outage, the state resulting from this flipping will be self-evident after power restoration. In other applications, it may be preferable to cause a load to be automatically deenergized or energized in response to loss and restoration of power. Such a preference may be realized through switch 10 programming, whether during production, during installation, or through a procedure available to a user or installer from the user interface of the switch 10 or from an external controller that serves as a part of a home automation control system. If installed in the same circuit, with the switch configured for off-after-power-loss (or on-after-power-loss), any action of flipping any number of other switches in the circuit while power is off will have no effect, and the inventive switch 10 will actuate one of the relays and, if necessary, deactuate that relay and actuate the other, to achieve a no-load state (or a loaded state, if possible and so programmed), as detected by the load detector 84 circuit function.

Nominal relay switching uses so-called break-before-make actuation timing. That is, if a circuit closure already exists, then the closed circuit must be reliably released before alternate-path conduction begins to occur. This may not be of concern for typical lighting applications. However, there are other uses for switch products. A possibility exists of applying a direct short circuit between power and neutral in event of a single system fault or certain installer errors. This dictates that ensuring mechanical and electrical disconnection of a first relay before allowing connection of a second relay can be seen as at least preferable for some embodiments. Product approval regulations may likewise mandate such configurations.

The above-described timing arrangements assure that transfer is substantially synchronous with mains power, that sufficient time around zero crossing is allowed for the contacts 58, 60 of the heretofore-actuated relay 54 or 56 to have assuredly moved apart sufficiently to have stopped conduction, and that the heretofore-deactuated relay 56 or 54 likewise engages around zero crossing, on the following cycle of mains power. The state so established will persist until a manual switch actuation or wireless control signal reverses the state of the switch 10, or until loss of mains power 408 or actuation of the air gap switch 74 shuts down the switch 10 for a time.

It may be observed that the above timing arrangement causes all transitions to occur after the conclusion of a succession of negative-going zero crossings of the mains power waveform. In embodiments wherein the zero crossing of each half-cycle of mains power is sensed, the delay intervals 178, 186, 198, 206 before triggering can be adjusted to deactuate and actuate the respective relays in response to zero crossings of successive half-cycles of mains power, for example, or on either successive positive-going or negative-going half-cycles, as selected by a user. It may be observed that time variations of one or two half-cycles of mains power, such as from touching a switch until a light turns on, introduce time delays too brief to be distinguished by human users. In typical applications, conduction is possible on only one of the runners 40, 42 until another switch in a the circuit is switched, so that load properties are substantially unaffected by the delay intervals described above.

Other embodiments may concatenate switching into a single sequence. In an arguably simplest form of this, a command-enabled sensing of zero crossing can trigger immediate shutoff of the heretofore-actuated relay 54 or 56, followed by a characterized wait interval and actuation of the heretofore-deactuated relay 56 or 54. This process can exceed a preferable +/−15 degree precision of switchover with reference to zero crossing for typical component types.

In a moderately relay-protective configuration, the transfer trigger can occur prior to mains power zero crossing, such as by measuring period as above, reducing the count with a count adjustment function prior to transferring it, and triggering transfer on a following zero crossing, as above. This can cause the heretofore-energized one of the relay drivers 80, 82 to shut off at a time that opens the associated relay's contact set 58, 60 closer to or prior to actual zero crossing, with the other relay's contact set 58, 60 thus able to establish conduction closer to actual zero crossing as well.

Calculation for an early down-count zero trigger of each of these types can use statistical testing of typical as-manufactured relays 54, 56 selected for inclusion in the switch 10. Values can also be established by pre- or post-installation testing of each relay 54 and 56, or can be established dynamically within each relay 54, 56 by detecting a time delay from driver 80, 82 transition to a detected zero-current event. The last of these may require additional instruction sequences within the controller 78 and an additional embedded detection function within the switch 10.

In yet another embodiment, a current detector 108 in concert with a voltage detector 110 can determine whether the load circuit is resistive (substantially synchronous zero crossing on the two detectors 108, 110), or is instead inductive (voltage leads current) or capacitive (current leads voltage). Since reactive loading can accelerate erosion of relay contacts, this phase detector function (108, 110, 78, and/or 92, and associated stored instructions) can be used to provide yet another correction function to the timing of the down-count zero triggers 180, 188, 200, 208, shown in FIG. 7B, particularly for delaying the opening of heretofore-closed contacts in an inductive load environment, further extending relay contact life.

In the above embodiments, operator application of sufficient pressure to the upper momentary switch 26 of FIG. 1, equivalent to transmission of a turn-on command from a remote controller (not shown), is interpreted as a command to place a load circuit in an "on" state, irrespective of the circuit's previous state. Likewise, momentary actuation of the lower switch 28, like transmission of a remote turn-off command, is interpreted as a command to turn place a load circuit in an "off" state, irrespective of its previous state. Each of these commands may be ignored (YES option in decisions 170, 172 in FIG. 7B) if the load circuit state would not change state in response thereto and the embodiment so permits. Required for this embodiment is a load detector 84 and a suitable associated controller 78/92 instruction sequence, causing a decision to toggle the switch state to be made in view of a load's having heretofore been in an "on" or "off" state. In other embodiments, any touch on a switch 26, 28 may be interpreted as a toggle command, or the user interface may be simplified to a single press-to-toggle switch; in these embodiments, the "do nothing" option may be locally unavailable.

Some embodiments can be configured to interpret any cluster of switch closure events, detected within a time window or prior to expiration of a time window having no such closures, as a single event. This can desensitize a device to switch closure noise or static discharge that might otherwise be interpretable as a plurality of switch closures, particularly beneficial in some single-button embodiments.

A representative embodiment for a NEC-compatible switch 10 as shown in FIG. 1 fits within a 3 inch by 2 inch box roughly 2 inches deep, wherein the box (represented schematically in FIG. 3, reference numeral 440) is recessed within a flat, vertical wall (not shown) to accept a switch 10 and a Decora® (™Leviton Manufacturing Inc.) cover plate (not shown) that fits flush to the wall, the box having been previously fitted with 14-gauge solid copper insulated wires for common, neutral, two runners, and safety ground (the safety ground wire is bare or green-insulated in U.S. service) of sufficient length to form NEC-stipulated service loops. Each of the runners is normally part of a four-conductor (so-called three-wire) jacketed cable, with the common, neutral, and safety ground present in both cables. Some installation arrangements may require four-wire (five conductor) cable. In other arrangements, one or more of the cables may be of two-wire (three conductors including ground) type, albeit not in lieu of required three- or four-wire cables. Individual wires may be drawn through or placed within metallic or insulating conduit, wireway, raceway, or the like in lieu of using jacketed cable or cablebus. Numerous other enclosing and wiring technologies, at least including those accepted by NFPA and described in NEC, may be suitable, so the foregoing is not intended to be limiting.

In other embodiments, the switch 10 of FIG. 1 may be implemented with wires, which may be solid or stranded, and would be jacketed for marking and electrical isolation, in lieu of the indicated screw terminals, permitting each connection to individual wires of premises wiring to use a twist-on wire connector such as a "Wire-Nut®" (™Ideal Industries, Inc.), or another, comparable attachment system. In still other embodiments, push-in contacts, blade contacts, fixed-position multi-contact connectors, or screw-tightened clamp terminals may be provided in lieu of or in addition to one of the above connection systems.

Because there is a radio transceiver assembly 96, shown in FIG. 2, within a substantially continuous nonconducting envelope 14 of the switch 10, it can be beneficial for system operation if both the electrical box 440 and the cover plate (not shown) are nonconducting and largely transparent to radio waves from 500 KHz to 5 MHz, in at least some embodiments. For embodiments wherein all loads are directly wired to a circuit including one or more switches, of which one is transceiver-controllable, there is less urgency for the load boxes 438, shown in FIGS. 3 and 4, and boxes and cover plates (not shown), for any manual-only switches to be radio-transparent.

The many features and advantages of the invention are apparent from the detailed specification, and, thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and, accordingly, all suitable modifications and equivalents may be resorted to that fall within the scope of the invention.

What is claimed is:

1. A remotely-controllable electrical switch, comprising:
   a housing having an outer envelope configuration compliant with standards for premises electrical power control devices;
   a plurality of electrical terminals configured to attach to premises electrical wiring multi-ampere power conductors;
   a first single-pole, single-throw relay and a second single-pole, single-throw relay, each configured to conduct multi-ampere electrical power from a common terminal of the plurality of terminals whereto first respective contacts of both of the relays are connected, to respective first and second runner terminals of the plurality of terminals, to each of which a second contact of one of the respective relays is connected, in response to application of an energization signal to an actuation element of one of the respective relays;
   a controller having a circuit switching routine that issues a relay deactuation command to deactuate a heretofore-actuated one of the respective relays and, thereafter, a relay actuation command to actuate a heretofore-deactuated one of the respective relays;
   a first counter function configured to acquire a first clock-based count value corresponding to a time interval between successive zero crossings or between successive zero crossings of like polarization;
   a second counter function configured to use the first count value as a basis for generating a count-based anticipated zero crossing time signal; and
   a relay transfer start function configured to initiate transfer from continuous actuation of the first relay to actuation of the second relay in response to the anticipated zero crossing time signal.

2. The remotely-controllable electrical switch of claim 1, further comprising:
   a plurality of relay driver circuits, each configured to accept application and removal of a logic-level actuation command from the controller and to apply or remove an energization signal to an actuation element of a respective one of the relays in response thereto.

3. The remotely-controllable electrical switch of claim 1, wherein the housing further comprises: an envelope configured to fasten within a standards-compliant single-gang flush mountable box for premises electrical wiring.

4. The remotely-controllable electrical switch of claim 1, further comprising: a transceiver configured to receive commands from a command device external to the switch and transfer command information so received to the controller of the switch.

5. The remotely-controllable electrical switch of claim 1, wherein the controller further comprises a control operation sequence that accepts a transceiver-furnished state reversal command and that issues a relay deactuation command to a heretofore actuated one of the respective relays and a relay actuation command to a heretofore deactuated one of the respective relays in response thereto.

6. The remotely-controllable electrical switch of claim 1, wherein the controller further comprises a control sequence directing break-before-make relay timing.

7. The remotely-controllable electrical switch of claim 1, further comprising an air gap switch configured to disable current flow through electrical paths within the switch from the common terminal to both runner terminals.

8. The remotely-controllable electrical switch of claim 1, further comprising a power supply circuit having a rectification and isolation diode from each of the common terminal and the plurality of runner terminals to a common input terminal of the power supply circuit, wherein the diodes have like polarization with reference to the common input terminal.

9. The remotely-controllable electrical switch of claim 8, further comprising an air gap switch configured to disable power supply output distribution to at least one functional unit within the switch.

10. The remotely-controllable electrical switch of claim 1, further comprising an air gap switch configured to apply an operational disable signal to the controller.

11. The remotely-controllable electrical switch of claim 1, further comprising a relay state timing control function configured to terminate application of a first energization signal to an actuation element of a first one of the respective relays at a time selected to perform relay contact separation near zero crossing of mains electrical power applied to the switch.

12. The remotely-controllable electrical switch of claim 11, wherein the relay state timing control function is further configured to initiate application of a second energization signal to an actuation element of a second one of the respective relays at a time selected to establish conduction between contacts of the second relay at a time later than completion of contact separation in the first relay.

13. The remotely-controllable electrical switch of claim 12, further comprising a count adjustment function configured to initiate the relay transfer start function at a time differing from that at which the anticipated zero crossing time signal occurs.

14. A remotely-controllable electrical switch, comprising:
a housing having an outer envelope configuration compliant with standards for premises electrical power control devices;
a plurality of electrical terminals configured to attach to premises electrical wiring multi-ampere power conductors;
a first single-pole, single-throw relay and a second single-pole, single-throw relay, each configured to conduct multi-ampere electrical power from a common terminal of the plurality of terminals whereto first respective contacts of both of the relays are connected, to respective first and second runner terminals of the plurality of terminals, to each of which a second contact of one of the respective relays is connected, in response to application of an energization signal to an actuation element of one of the respective relays;
a controller having a circuit switching routine that issues a relay deactuation command to deactuate a heretofore-actuated one of the respective relays and, thereafter, a relay actuation command to actuate a heretofore-deactuated one of the respective relays;
a plurality of diodes instantaneously directing input energy, from at least one of the common, first runner, and second runner nodes that has sufficient, properly-polarized voltage present thereon to energize the power supply, to a common feed point of the power supply;
a dual-relay actuation configuration, wherein timing of actuation from a first switch state to a second switch state depends in part on both a delay following removal of a relay actuation signal from a relay actively conducting in the first state and a delay following application of a relay actuation signal to a relay not actively conducting in the first state, and wherein timing of actuation from the second switch state to the first switch state depends in part on both a delay following removal of a relay actuation signal from the relay actively conducting in the second state and a delay following application of a relay actuation signal to the relay not actively conducting in the second state;
a load status detector configured to discriminate between a first condition, wherein current is flowing in an electrical load connected to the switch, and a second condition, wherein no current is flowing in the electrical load connected to the switch, independent of the switch state;
an optoisolator, wherein the optoisolator includes a two-terminal, bidirectional, AC-compatible input section connected in current-limited fashion between the first and second runner nodes, and wherein the optoisolator further includes an output section that provides one of two distinct, logic-circuit-compatible states in response to existence or absence of a complete circuit drawing electrical current above a selected level from the mains power hot side, through the switch, through a load, to the mains power neutral side;
an interface function within a controller part of the switch, configured to distinguish the two optoisolator states as distinct logic states; and
a display control function within the controller part of the switch, configured to interpret the existence of the current-drawing circuit as a loaded state and actuate a display in event thereof, and to deactuate the display in event of the absence thereof.

15. A remotely-controllable electrical switch, comprising:
an insulated housing configured to mount within a standard wall-mount, flush-mount, single-gang electrical wiring box along with associated wiring for two-way or three-way switches;
a safety ground terminal, a neutral terminal, a common terminal, and two runner terminals, each configured to connect to at least one solid 12-gauge copper conductor;
an operator interface panel at the wall surface that includes a load status indicator, an air gap switch, and a rocker-style operator switch providing single-pole, double-throw, center-off, momentary-contact functionality, wherein one actuating pole of the rocker switch is located above the other in vertically-mounted orientations;

a first single-pole, single-throw, normally-open, coil-driven relay and a second like relay, each configured to conduct multi-ampere electrical power from the common terminal of the switch, whereto first respective contacts of the contact sets of both of the relays are connected, to respective first and second runner terminals, to each of which a second contact of one of the respective relay contact sets is connected, in the alternative, in response to application of a coil drive signal to one of the respective relays; and a controller that, upon application of mains power with the air gap switch in its operational state, applies a coil drive signal to the relay actuated by the lower contact of the rocker switch, compares a resulting load state to a previously-stored load state, remains in that state if the load states agree, and reverses to drive the other relay if the load states differ, wherein coil drive signal application timing includes relay contact making and breaking conduction timing that coincides, with selected accuracy, with zero crossing of the mains power waveform, and wherein each break in contact conduction by a relay precedes making contact conduction by the other relay by a selected time interval.

16. The remotely-controllable electrical switch of claim 15, wherein the previously-stored load state is fixed to a deenergized state.

\* \* \* \* \*